United States Patent
Mehrl et al.

(10) Patent No.: US 10,847,664 B2
(45) Date of Patent: Nov. 24, 2020

(54) OPTICAL PACKAGE AND METHOD OF PRODUCING AN OPTICAL PACKAGE

(71) Applicant: ams AG, Unterpremstaetten (AT)

(72) Inventors: David Mehrl, Plano, TX (US); Thomas Bodner, Seiersberg (AT); Gregor Toschkoff, Graz (AT); Harald Etschmaier, Graz (AT); Franz Schrank, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/773,539

(22) PCT Filed: Nov. 4, 2016

(86) PCT No.: PCT/EP2016/076695
§ 371 (c)(1),
(2) Date: May 3, 2018

(87) PCT Pub. No.: WO2017/077051
PCT Pub. Date: May 11, 2017

(65) Prior Publication Data
US 2018/0323320 A1 Nov. 8, 2018

Related U.S. Application Data

(60) Provisional application No. 62/252,320, filed on Nov. 6, 2015.

(30) Foreign Application Priority Data

Dec. 8, 2015 (EP) .................................... 15198468

(51) Int. Cl.
*H01L 31/0232* (2014.01)
*H01L 31/0203* (2014.01)
(Continued)

(52) U.S. Cl.
CPC .......... *H01L 31/02327* (2013.01); *G02B 3/04* (2013.01); *G02B 19/0028* (2013.01);
(Continued)

(58) Field of Classification Search
CPC ......... H01L 33/56; H01L 33/58; H01L 33/60; H01L 33/62
See application file for complete search history.

(56) References Cited

U.S. PATENT DOCUMENTS

2005/0168846 A1 * 8/2005 Ye ........................ H04N 5/2254
359/819
2006/0091784 A1    5/2006 Conner et al.
(Continued)

FOREIGN PATENT DOCUMENTS

EP    1289281 A1    3/2003
EP    2466341 A1    6/2012
(Continued)

*Primary Examiner* — Ermias T Woldegeorgis
(74) *Attorney, Agent, or Firm* — MH2 Technology Law Group LLP (57) ABSTRACT

An optical package is proposed comprising a carrier, an optoelectronic component, an aspheric lens, and a reflective layer. The carrier comprises electrical interconnections and the optoelectric component is arranged for emitting and/or detecting electromagnetic radiation in a specified wavelength range. Furthermore, the optoelectric component is mounted on the carrier or integrated into the carrier and electrically connected to the electric interconnections. The aspheric lens has an upper surface, a lateral surface, and a bottom surface and the bottom surface is arranged on or near the optoelectric component. The aspheric lens comprises a material which is at least transparent in the specified wavelength range. The reflective layer comprises a reflective material, wherein the reflective layer at least partly covers the lateral surface of the aspheric lens, and wherein the
(Continued)

reflective material is at least partly reflective in the specified wavelength range.

18 Claims, 3 Drawing Sheets

(51) Int. Cl.

| | |
|---|---|
| H01L 33/58 | (2010.01) |
| H01L 27/146 | (2006.01) |
| H01L 33/46 | (2010.01) |
| G02B 3/04 | (2006.01) |
| G02B 19/00 | (2006.01) |
| H01L 31/02 | (2006.01) |
| H01L 31/18 | (2006.01) |
| H01L 33/00 | (2010.01) |
| H01L 33/56 | (2010.01) |
| H01L 33/60 | (2010.01) |
| H01L 33/62 | (2010.01) |

(52) U.S. Cl.
CPC ..... *G02B 19/0061* (2013.01); *G02B 19/0076* (2013.01); *H01L 27/14618* (2013.01); *H01L 27/14625* (2013.01); *H01L 27/14683* (2013.01); *H01L 27/14685* (2013.01); *H01L 31/0203* (2013.01); *H01L 31/02005* (2013.01); *H01L 31/0232* (2013.01); *H01L 31/1876* (2013.01); *H01L 33/0095* (2013.01); *H01L 33/46* (2013.01); *H01L 33/56* (2013.01); *H01L 33/58* (2013.01); *H01L 33/60* (2013.01); *H01L 33/62* (2013.01); *H01L 27/14623* (2013.01); *H01L 2933/005* (2013.01); *H01L 2933/0058* (2013.01); *H01L 2933/0066* (2013.01)

(56) References Cited

U.S. PATENT DOCUMENTS

| | | |
|---|---|---|
| 2007/0001187 A1 | 1/2007 | Kim |
| 2013/0128020 A1* | 5/2013 | Fujimori ................ A61B 1/051 348/65 |
| 2014/0145069 A1* | 5/2014 | Earman ............ H01L 31/02327 250/214 SW |

FOREIGN PATENT DOCUMENTS

| | | |
|---|---|---|
| EP | 2597860 A1 | 5/2013 |
| EP | 2966491 A1 | 1/2016 |
| JP | H1010394 A | 1/1998 |
| JP | 2005064198 A | 3/2005 |

\* cited by examiner

OPTICAL PACKAGE AND METHOD OF PRODUCING AN OPTICAL PACKAGE

This invention relates to an optical package and to a method of producing an optical package.

BACKGROUND OF THE INVENTION

Existing optical sensor packages typically employ optical interference filters and often must fulfil conflicting requirements. Ambient Light Sensing (ALS) applications, for example, often seek to have a wide angular field of view, yet a small range of incident angles on filter and sensor. For example, interference filters often have issues with progressively larger wavelength shifts in their spectral response curves as the incident light impinges at increasing off-axis angles.

A conventional approach to solving this problem is through the use of a small diffuser aperture placed near the outer surface of the device that the sensor is embedded in, e.g. a cell phone or tablet, while using a large air gap between sensor and aperture, such that the angle of view, from the standpoint of the interference filter covering the sensor, subtends a much smaller angle. This accomplished the goal, albeit at the cost of very significant reduction of optical signal (typically 10× to 20× attenuation).

Another existing problem in many packages is that of blocking crosstalk, especially infrared (IR) light. For example, light can penetrate dark-mold compounds in very small packages when the thickness of the mold compound is not sufficiently thick to completely attenuate the light. Light leakage tends to increase significantly at longer (near visible IR, or NIR) wavelengths. Unfortunately, environments such as sunlight, and indoor halogen/incandescent lighting contain large amounts of NIR light.

SUMMARY OF THE INVENTION

In at least one embodiment an optical package comprises a carrier, and optoelectronic component, and aspheric lens, and a reflective layer.

The carrier comprises electrical interconnections. The carrier is a semiconductor substrate or wafer, for example. The interconnections may form a wiring, in particular, through-substrate vias, and can be produced in a standard CMOS process, for example. Furthermore, the electric interconnections may be provided with bumper contacts for external electric connection to further integrated components.

The optoelectronic component is arranged for emitting electromagnetic radiation in a specified wavelength range. The optoelectronic component can also be arranged for detecting electromagnetic radiation in the specified wavelength range. Examples include optical sensors or optical emitters. The specified wavelength range includes at least parts of the electromagnetic spectrum, like the visual, infrared and/or ultraviolet part of the spectrum. The optoelectronic component can either be mounted on the carrier or be integrated into the carrier. In either case the optoelectronic component is electrically connected to the electric interconnections. For example, the optoelectronic component and the carrier can be produced in a CMOS process or may form a three dimensional integrated circuit.

The aspheric lens has an upper surface, a lateral surface and a bottom surface. The lateral surface surrounds the aspheric lens. The bottom surface is arranged on or near the optoelectronic component. The aspheric lens comprises a lens material which is at least transparent in the specified wavelength range. The lens material may comprise a moldable glass such that the aspheric lens can be fabricated by means of a molding process at wafer-level, e.g. by precision glass molding.

The reflective layer comprises a reflective material and at least partially covers the lateral surface of the aspheric lens. The reflective material is, at least in parts, reflective in the specified wavelength range. For example, the reflective layer can be in direct contact to the lateral surface, be coated onto the lateral surface or arranged around the lateral surface with a small gap or void. The gap may be small enough to prevent for total internal reflection within the aspheric lens. The reflective layer can be an external, layer which can be fabricated independently and is attached to the aspheric lens. The reflective layer could also be coated on the lateral surface of the aspheric lens. For example, the reflective layer may be a metal layer comprising one or more types of metal and/or the metal-based alloy. The reflective layer may be a reflective coating based on one or more dielectric layers.

The aspheric lens directs incident light from its upper surface via its bottom surface towards the optoelectronic component. Light incident from small angles of incidence is refracted by the lens material. However, light incident from larger angles of incidence can also reach the optoelectronic component. Such light not only gets refracted by the lens but also undergoes one or more reflections due to the reflective material of the reflective layer.

The reflective layer, however, has an additional effect. Light can mostly enter the aspheric lens and reach the optoelectronic component via the upper surface of the aspheric lens. The reflective material of the reflective layer shields the aspheric lens from light impinging on the lateral surface of the lens. The actual choice of reflective material largely defines whether such stray light can enter the aspheric lens and eventually give rise to optical crosstalk.

The term "aspheric lens" denotes a lens having a surface profile which does not necessarily completely derive from a sphere or a cylinder. The surface profile can take a wide variety of forms and can be described as a function of distance with respect to an optical axis of the lens, for example. In general, the aspheric lens does not necessarily have a radius of curvature. The aspheric lens may have at least one axis of rotational symmetry, e.g. with respect to an optical axis. In addition, the aspheric lens could be conical such as having a truncated conical shape, or it could also include shapes without rotational symmetry such as truncated pyramid shapes including e.g. three-sided and four-sided pyramid shapes that are typically also truncated near the top of the pyramid.

The term "optoelectronic component" denotes electronic devices that source, detect and/or control light. In this context, light often includes forms of electromagnetic radiation invisible to the human eye such as ultraviolet and infrared, in addition to visible light. The latter forms are considered as "optical" hereinafter. Optoelectronic devices are electrical-to-optical or optical-to-electrical transducers, or instruments that use such devices in their operation. Consequently, an optical sensor or optical emitter is considered a device that is arranged for emitting and/or detecting electromagnetic radiation in an optical wavelength range. The term "transparent" denotes an optical property of materials that allows the at least partial transmission of light waves through them.

In at least one embodiment the reflective layer covers the lateral surface completely. In addition or alternatively the reflective layer covers at least parts of a main surface of the carrier. In particular, the main surface of the carrier may be completely covered by the reflective layer.

The reflective layer shields the aspheric lens and/or the main surface of the carrier from stray light. By covering the larger parts or the respective surfaces completely, incident light can only enter the aspheric lens and reach the optoelectronic component via the upper surface of the aspheric lens, by this optical crosstalk can effectively be reduced.

In at least one embodiment an encasement comprises a filler material and is arranged on the carrier. The encasement comprises sidewalls which at least partly encloses the lateral surface of the aspheric lens. The encasement may encapsulate the aspheric lens, i.e. the sidewalls are in direct contact with or close to the lateral surface.

The filler material can be chosen to be a non-transparent material, such that it blocks light from going through the enclosed lateral surface of the aspheric lens. Furthermore, the filler material can be chosen to have a higher index of refraction compared to the lens material. This way no total internal reflection occurs at the boundary of the lateral surface to the sidewalls of the encasement.

The optical package can be used with only the reflective layer. However, the encasement gives a robust, easy-to-handle optical package. For example, the non-rectangular shape of the resulting product without encasement might make it hard to handle by pick-and-place machines used in the assembly process etc. Therefore, one option is to fill the voids between lenses with a black or otherwise coloured filler material to arrive at a rectangular package.

At least one embodiment the reflective layer is coated onto or otherwise attached to the lateral surface on the aspheric lens. In addition, or alternatively, the reflective layer is coated onto or otherwise attached to the sidewalls of the encasement. For example, depending on the process flow the reflective layer can be coated on or otherwise attached to the lateral surface, the sidewalls or both. For example, the encasement can be produced in a separate process and be assembled (including the reflective layer) with the carrier having the lens at a later stage.

In at least one embodiment, the reflective material of the reflective layer comprises at least one type of metal and/or a metal alloy. The types of metal may, for example, include aluminium, chrome, gold, silver, and/or an alloy thereof. For example, the specified wavelength range determines the choice of material as reflectivity typically depends on wavelength.

In at least one embodiment the filler material is opaque, at least in the specified wavelength range. In particular, the filler material comprises a moldable material. For example, the filler material may have different colours such as black or white. For example, when using only the metallized aspheric lens it will appear reflective and shiny on the outside, making the part highly visible, e.g. to a cell-phone owner who could easily see shiny parts as typically they reside beneath the cell phone aperture. Opaque and/or coloured filler material allows greater design freedom.

In one embodiment the optical electric component comprises at least one of the following components: an optical sensor, an ambient light sensor, a colour sensor, an optical proximity sensor, or a gesture sensor. The optical electric component may comprise one or more photodiodes translated or light emitting diodes.

In at least one embodiment the aspheric lens has an optical axis. The lateral surface, at least in sections, has an aspherical surface profile defined with respect to the optical axis. The aspherical surface profile's curvature changes across the lateral surface and is therefore usually defined by an analytical formula or by means of a general conical surface (or a frustum thereof). Typically, the aspheric surface is a rotationally symmetric surface with respect to the optical axis defined between the upper and bottom surface.

In at least one embodiment the aspheric surface profile, at least in sections, is hyperbolic, parabolic, elliptical, linear, conical and/or tapered (or a frustum thereof).

Generally, the upper surface may essentially be flat, e.g. orthogonal with respect to the optical axis or may be described by a spheric or aspheric surface profile as well.

In at least one embodiment a length of the aspheric lens measured along its axis or optical axis connecting the upper and the bottom surface is at least equal or greater than a width of the bottom surface. In other words, the aspheric lens may be elongated along its optical axis, e.g. being broader than the bottom surface. The aspherical surface profile may be tapered from the upper surface towards the bottom surface. For example, a ratio between width and length is about 1:2, 1:3, 1:4 etc.

In at least one embodiment the width of the bottom surface is at least equal or greater than a width of the light sensitive area or light emitting area of the optoelectronic component. For example, the width of the light sensitive area or light emitting area can serve as a design constraint. The aspheric lens is constructed such that it guides incident light towards the optoelectric component. Typically, however, the length of the aspheric lens is also restricted to achieve smaller package heights. Thus, width and length of the lens are typically given parameters of a specific applications.

In at least one embodiment the diffuser is arranged at or near the upper surface of the aspheric lens. For example, it may also be advantageous to still use a diffuser placed on top of the package such as an aperture in the encasement. For example, the height of the aspheric lens may have to be reduced to achieve smaller package heights in some situations. A "taper angle" of the lenses is more efficient if it is steep, e.g. about 8.5 degrees (measured with respect to a surface normal on the upper lens surface), and the optical performance can degrade as this angle is increased to some 20 degrees, for example. This can degrade the "smoothness" of the angular response, such that a near cosine response could develop a significant amount of "ripple" in it.

This ripple can be reduced by using a weak diffuser. The point here is that the diffuser can be much less diffusive than those used in conventional solutions that rely solely on a diffuser. The result are package heights that are smaller, but offer improved optical efficiency over the conventional optical packages that rely solely on a diffuser to achieve the angular response goals outlined earlier. In addition, if e.g. a white diffuser was applied, then parts such as the optoelectric component would be well camouflaged if placed against an aperture in a "white" cell phone or tablet.

In at least one embodiment a method of producing an optical package comprises the following steps.

A wafer is provided as carrier and comprises one or more electrical interconnections. At least one optoelectric component is mounted on the wafer or into the wafer. The optoelectric component is arranged for emitting and/or detecting electromagnetic radiation in a specified wavelength range. The optoelectric component is electrically connected to the one or more electric interconnections.

At least one aspheric lens is formed from a material which is at least transparent in the specified wavelength range. The aspheric lens has an upper surface, lateral surface, and a bottom surface. The lateral surface is surrounding the aspheric lens. The aspheric lens is arranged with its bottom surface placed on or near the optoelectric component.

Finally, at least parts of the lateral surface of the aspheric lens is covered with a reflective layer. The reflective layer comprises a reflective material which is at least partly reflective in the specified wavelength range.

In at least one embodiment an encasement is formed on the wafer using a filler material. Sidewalls are formed which are at least partly enclosing the lateral surface of the aspheric lens. The filler material can be added between the aspheric lens or lenses so that the encasement encapsulates the aspheric lens or lenses.

The reflective layer already blocks light (including NIR) from coming into the aspheric lens, thus it can improve or entirely replace the light blocking action that in conventional solutions is done using a black mold compound. Addition of the filler material further improves package robustness, handling, etc. Black material will give the most thorough side-light blocking, but other colours including white are also feasible for design reasons, for example.

In at least one embodiment the reflective layer is coated at least on the sidewalls of the encasement and/or the reflective layer is coated on the lateral surface of the aspheric lens.

The reflective layer can be applied to the lateral surface directly or at least with a small gap or void. One variation of the process flow is to produce a separate encasement with cavities adjusted or fitted for the aspheric lenses, for example, by molding technology. The inside of those cavities can be coated with the reflective layer, and the encasement is attached or glued to the wafer.

In at least one embodiment an aperture is formed in the encasement at or near the upper surface of the aspheric lens. The upper surface of the aspheric lens protrudes into the aperture. Alternatively the upper surface is modified to flush with an outer surface of the encasement.

In at least one embodiment the plurality of optical packages produced according to the concept described above are arranged on the wafer. The wafer carrying the plurality of optical packages is than a single light it into a single optical packages.

The proposed optical package and method for producing an optical package has many advantages over conventional solutions. For example, they allow for an increased sensitivity and are less prone to optical crosstalk. The use of a reflective layer or coating on the lateral surface of the aspheric lens (such as aluminium or chrome) allows light to enter the lens only or mostly through its upper surface.

Lateral reflective layer provides a reflective surface and robust light blocking (including NIR) from light impinging on the sides of the lens. The filler material can be black or any other colour and is encapsulating the lens. It gives a robust, easy-to-handle package. Metallizing (e.g. aluminizing) the sidewalls of the encasement provides reflective optics in lieu of molded lenses to shape light paths (focussing/defocusing of light etc.).

Among others, advantages of the proposed optical package and method for producing an optical package further include:
 robust blocking of light impinging from the sides of the package,
 easier assembly and alignment of the encasement, e.g. the optical package does not rely on TIR (Total Internal Reflection) of the lens walls,
 improved light gathering efficiency compared to the more standard diffuser approach,
 no surface cavities on the optical package that may accumulate dust or other pollution,
 provides a tightly sealed package which may also perform better in bias-humidity environmental testing,
 grinding and polishing allows robust fabrication of very small optical apertures and further improve the optical attenuation, while reducing issues of aligning apertures with the lenses,
 small apertures can be virtually invisible to the end user, eliminating the need for manufacturers to use dark ink to camouflage electronic components,
 potentially a cost effective packaging methodology as application on wafer level possible.

In the following, the concept presented above is described in further detail with respect to drawings in which example embodiments are presented. Components that correspond to similar are designated with the same reference numerals.

DETAILED DESCRIPTION

Figure 1:
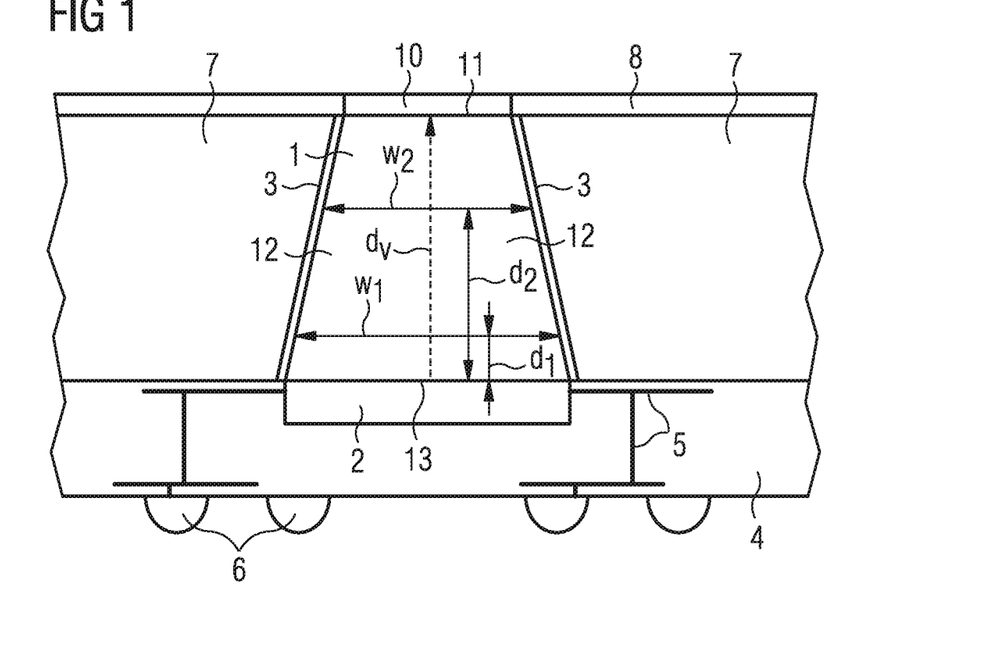
FIG. 1 shows a cross section of an example embodiment of an optical package.

FIG. 1 shows a cross section of an example embodiment of an optical package. The optical package comprises a carrier 4, an optoelectronic component 2, an aspheric lens 1, and a reflective layer 3.

The carrier 4 comprises electrical interconnections 5. In this particular embodiment these are implemented as through substrate vias or wiring and electrically connect the optoelectric component 2 with an underside of the carrier 4. Bump contacts 6 are arranged at the underside of the carrier 4 for external electric connection of the optical package. The carrier 4 may be a semiconductor substrate, for example a wafer, so that the optical package can be produced in a CMOS process at the wafer level minimizing footprint and assembly costs. The carrier 4 may instead be any other carrier suitable for optoelectronic packages, like a printed circuit board, for instance.

The optoelectric component 2 is mounted on or into the carrier 4 using semiconductor technology, for example. Generally, the optoelectric component 2 is arranged for emitting and/or detecting electromagnetic radiation within a certain specified wavelength range. The optical package can be used with a wide range of optoelectric components such as optical sensors and/or optical emitters. Examples include ambient light sensors, color sensors, active optical proximity sensors, especially photodiodes and light emitting diodes. Typically, further optical components like an interference filter may optionally be arranged at or on the optoelectronic component 2 (not shown).

The aspheric lens 1 is arranged at or on the optoelectronic component 2 and comprises a transparent lens material such as an optical mold. The aspheric lens 1 is limited by boundary surfaces, i.e. an upper surface 11, a lateral surface 12, and a bottom surface 13. The bottom surface 13 faces the optoelectronic component 2 and may be contiguous with a surface of the optoelectronic component 2. The upper surface 11 faces away from the optoelectronic component 2 and into an aperture 10 arranged in the encasement 7. The upper surface 11, in this particular embodiment, is flush with an outer surface of the encasement 7. Furthermore, the upper surface 11 comprises an essentially flat surface.

An aperture 10 can be formed by the encasement 7, or by means of an optional cap layer 8 with a window provided to form the aperture 3 as shown in the drawing. The cap layer 8 may be opaque or semi-transparent to shield stray light, and its transparency may especially depend on the wavelength. In particular, the cap layer 8 may be formed by a metal shield, for instance.

The lateral surface 12 surrounds the aspheric lens 1. In this embodiment the aspheric lens 1 constitutes a conical frustum and the lateral surface 12 is tapered towards the bottom surface 13. In general, a surface profile of the aspheric lens 1 can be described by an analytical formula such as an aspheric surface profile.

In this embodiment the aspheric lens 1 is rotationally symmetric about an optical axis which can be defined by a direction pointing from the bottom surface 13 towards the upper surface 11. This will be designated as a vertical direction $d_v$. A direction orthogonal to the vertical direction $d_v$ is specified as a relevant lateral direction. Widths $w_1$, $w_2$ of the aspheric lens 1 are defined parallel to said lateral direction and are limited by the lateral surface 12. FIG. 1 shows a first width $w_1$ at a first distance $d_1$ from the bottom surface 13 and a smaller second width $w_2$ at a larger second distance $d_2$ from the bottom surface 13. Due to the tapered surface of the aspheric lens 1 the widths $w_1$, $w_2$ decrease along the optical axis in the vertical direction $d_v$ from a maximal width at the bottom surface 13 to a non-vanishing minimal width at the upper surface 11.

The reflective layer 3 comprises a reflective material. Reflectivity typically is a function of wavelength. Thus, the reflective material is at least partly reflective in the specified wavelength range of the optoelectric component 2. Such materials include metals and metal alloys. For example, Aluminum (Al) yields a reflectivity of around 88% to 92% over the visible spectrum. Silver (Ag) has a reflectivity of 95% to 99% which extends even into the far infrared, but suffers from decreasing reflectivity (<90%) in the blue and ultraviolet spectral regions. Gold gives excellent (98% to 99%) reflectivity throughout the infrared, but has limited reflectivity at wavelengths shorter than 550 nm, resulting in the typical gold color. More complex reflective layers can be used to increase the reflectance. Such a metal would consist of several dielectric layers with alternating high and low indices of refraction, for example.

While metal can be as a material other reflective materials are possible as well. These include dielectric coatings such as high-reflection (HR) coatings, e.g. composed from two materials, one with a high index of refraction, such as zinc sulfide (n=2.32) or titanium dioxide (n=2.4) and low index material, such as magnesium fluoride (n=1.38) or silicon dioxide (n=1.49).

The reflective layer 3 in this embodiment covers the lateral surface 13 of the aspheric lens 1 completely. With the reflective layer 3 on lateral surface 13 of the aspheric lens 1 only the upper surface 12 is exposed for light entrance. The reflective layer 3 provides a reflective surface and robust light blocking (including NIR) from light impinging on the sides of the lens 1.

The encasement 7 comprises a filler material and is arranged on the carrier 4. For example, the encasement 7 can be formed by molding the filler material onto the carrier 4. The encasement comprises sidewalls which are in direct contact with or encapsulating the reflective layer 3. In fact, the reflective layer 3 can be coated onto the sidewalls or other surfaces of the encasement 7. As mentioned above the reflective layer 3 can be coated onto the lateral surface 12 of aspheric lens such that the encasement 7 can be placed on the reflective layer 3. The filler material can be opaque within the specified wavelength range. Colours are possible as well to meet certain design constraints of a mobile device, for example. Furthermore, the filler material can be chosen to have a higher index of refraction compared to the lens material. This way no total internal reflection occurs at the boundary of lateral surface to sidewalls of the encasement.

Figure 2:
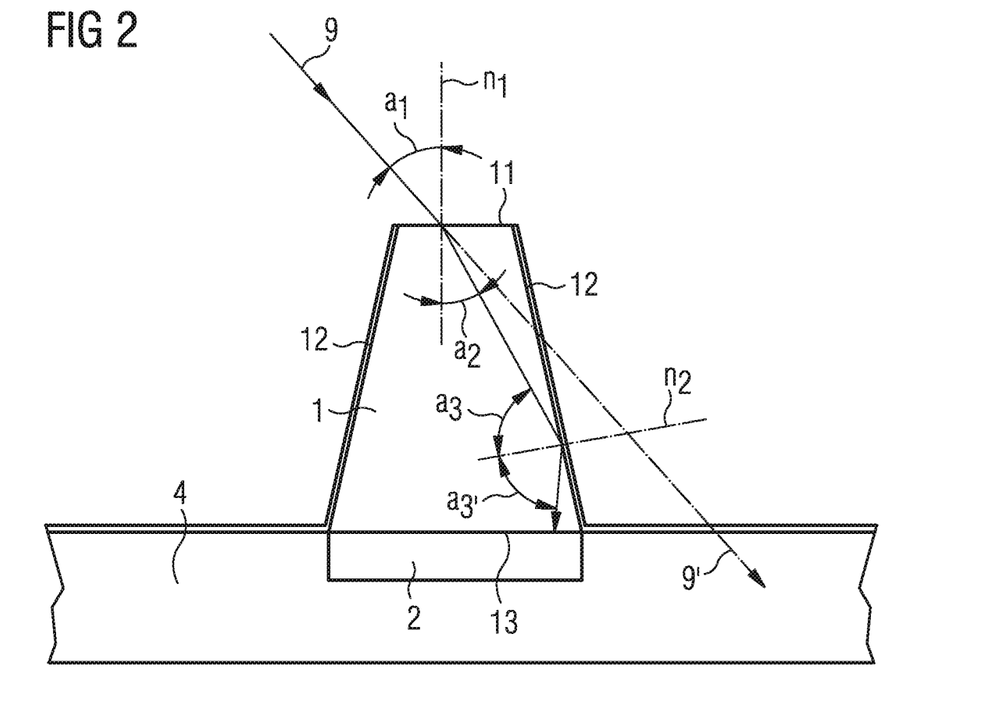
FIG. 2 shows a cross section of another example embodiment of an optical package.

The operation of the proposed optical package will be described with respect to FIG. 2. FIG. 2 shows a cross section of another example embodiment of an optical package. The reflective layer 3 covers both the lateral surface 12 of the aspheric lens 1 and a main surface of the carrier 4 completely. In this particular no encasement 7 is present or has not yet been placed onto the carrier 4.

FIG. 2 shows a ray 9 of incident light impinging on the upper surface 11 of the aspheric lens 1 at an angle a1 of incidence with respect to the normal n1 to the upper surface 11. The angle a2 of refraction differs from the angle a1 of incidence according to Snell's law, taking account of the index of refraction of the aspheric lens 1. The direction of the ray 9 thus deviates within the lens 1 from the direction of a virtual straight ray 9'. The refracted ray 9 reaches the lateral surface 12 of the aspheric lens 1 at a further angle a3 of incidence with respect to the normal n2 to the lateral surface 12. The ray 9 is reflected by the reflective layer 3. The angle a3' of reflection is the same as the further angle a3 of incidence, and the ray 9 is thus ultimately directed onto the optoelectronic component 2. The original inclination of the ray 9 with respect to the normal n1 is thus decreased, and the field of view of the optoelectronic component 2 is enlarged. The direction of the ray 9 may be reversed, if the optoelectronic component 2 is a light-emitting device, for example.

A method for producing the optical package can be summarized as outlined below:

1. Lens formation.
   The first step is the placement of one or more transparent aspheric lenses 1 over an optical sensor or optical emitter.
2. (Optional) Addition of sacrificial layer.
3. Application of reflective layer.
   Next, a reflective layer 3 is applied to a surface (at least on parts of the lateral surface 12 of the aspheric lenses 3 in the array.
4. (Optional) Forming an encasement 7.
5. (Optional) Removal of reflective material.
   For light to enter the lens, the upper surface 11 of the aspheric lenses needs to be freed of reflective material.
6. (Optional) Additional layers such as a transparent foil or a diffuser may be added onto the top of the aspheric lenses.
7. Finally, the wafer is singulated or diced, yielding the final optical packages.

Figure 3:
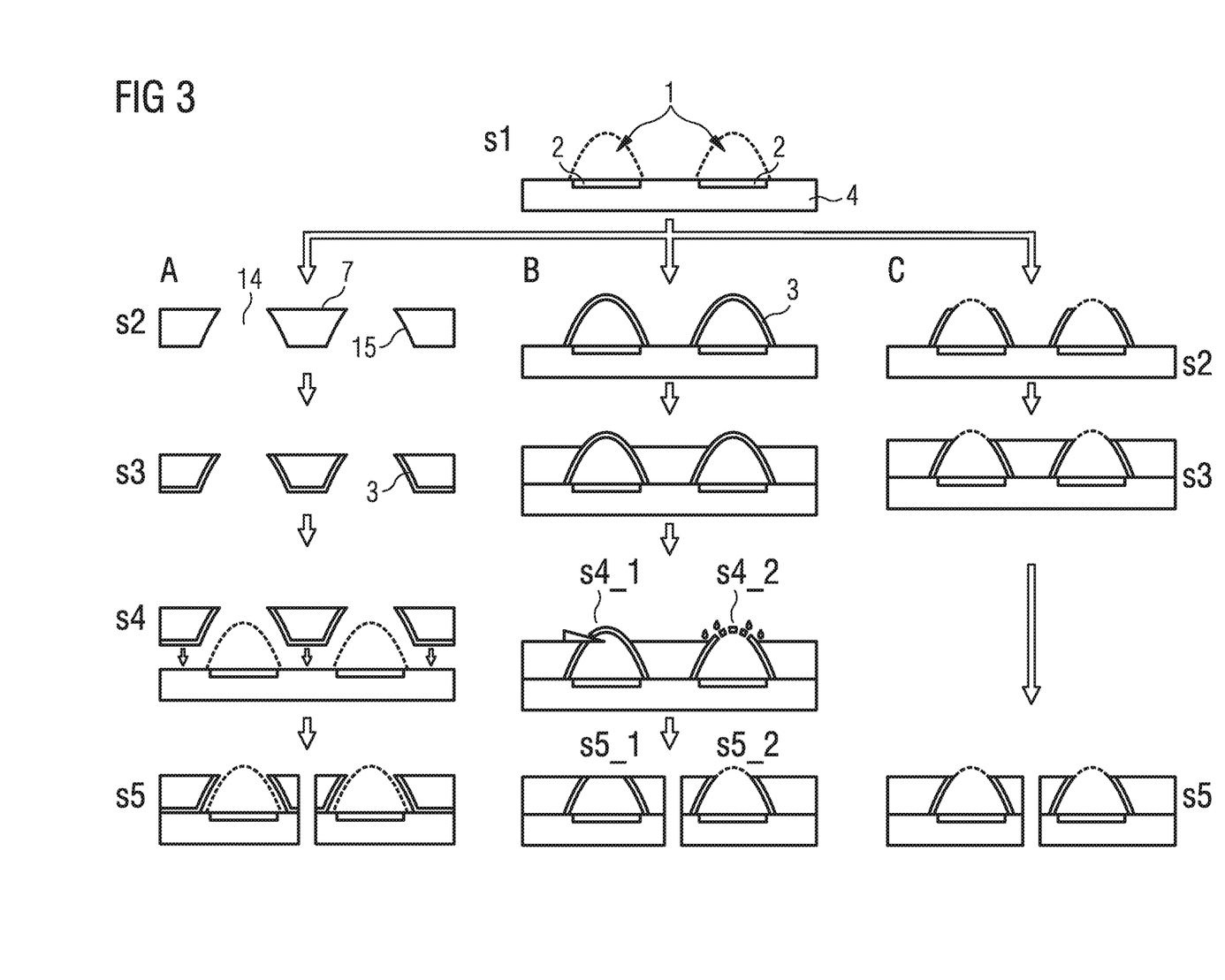
FIG. 3 shows an overview of different embodiments of a method for producing the optical package.

FIG. 3 shows an overview of different embodiments of a method for producing the optical package. In a first step s1 an array of aspheric lenses 1 is created on a wafer surface as mentioned in the summary above. In one embodiment, the array of aspheric lenses 1 is created directly on the wafer surface as carrier 4 using a wafer level transfer molding process. In another method, the aspheric lenses 3 are prefabricated and attached to the wafer or wafer parts (including single dies).

After the lens formation the method can proceed in at least three different ways A, B, and C. In the first approach A a separate encasement 7 is produced from the filler material. The encasement 7 comprises cavities 14 which are adjusted to fit the aspheric lenses 1. In step s3 an inside surface 15 of those cavities 14 is metallized with the reflective layer 3. This could be done, e.g. using a common vacuum evaporation process or sputtering process. Typical reflective material may include a metal comprising aluminium, although other choices (such as chrome) are possible. The so metallized encasement 7 is placed onto the wafer in step s4 and attached to the wafer in step s5. As depicted in the drawing a gap or void can be provided in between the encasement 7 and the aspheric lenses 1, for example to provide mechanical flexibility and reduce mechanical stress.

In the second approach B no separate encasement 7 is produced from the filler material. Instead step s2 involves application of the reflective layer 3 at least onto the lateral surfaces 12 of the aspheric lenses 1. This could be done, e.g. using a common vacuum evaporation process or sputtering process. Furthermore, the reflective layer 3 can also be applied to a large part or the entire wafer surface. In step s3 then the filler material is added between the aspheric lenses 1 in order to form the encasement 7.

The reflective layer 3 already blocks light (including NIR) from coming into the lateral surfaces 12 of the aspheric lenses 1, thus it can improve or entirely replace the light blocking action that is normally done using black mold compound. Addition of the filler material may be considered for various reasons (package robustness, handling, etc.). Black material will give the most thorough side-light blocking, but other colours including white are also feasible.

In step s4 the aspheric lenses are freed from reflective material. Typically the reflective material from the upper surface 11 needs to be removed. When a filler material between aspheric lenses is used, the exposure of the upper surfaces 11 is executed once the filler is hardened. For example in step s4_1, this could be done by a CMP (chemical-mechanical polish) or by mild mechanical grinding following by polishing. It can also be possible to cut a thin layer from the upper surface, for example via an approach similar to tape planarization. The resulting upper surfaces 11 are essentially flat and flush with an outer surface of the encasement 7 (see step s5_1).

Another approach is to selectively etch the reflective material from the upper surface 11 (see step s4_2). The filler material may protect the surfaces other than the lens upper surface from etching. If this is not the case, for example, a dedicated protective layer could be applied to the other surfaces, or only the upper surfaces 11 are brought into contact with the etching substances. The resulting upper surfaces 11 are free of reflective material and may protrude out of the encasement 7 (see step s5_2).

The third approach C is similar to the second approach B. However, the upper surfaces 11 are excluded from coating, for example by covering the top by a shadow mask in step s2. This way step s4 can be omitted. Another approach (not shown) is to add a sacrificial layer to the upper surfaces 11 that is removed after application of the reflective material, e.g. after metallization, by means of a lift off process, for example.

FIG. 4 shows an embodiment of a method for producing the optical package. Depicted is a typical processing sequence for wafer-level packaging with through substrate vias (TSV). Not shown here is that the final product could also have a weak diffuser bonded to a top of the package. Alternately the top of the wafer could even be treated to create weakly diffusive surfaces at the upper surfaces 11 of the aspheric lenses 1.

Figure 4A:
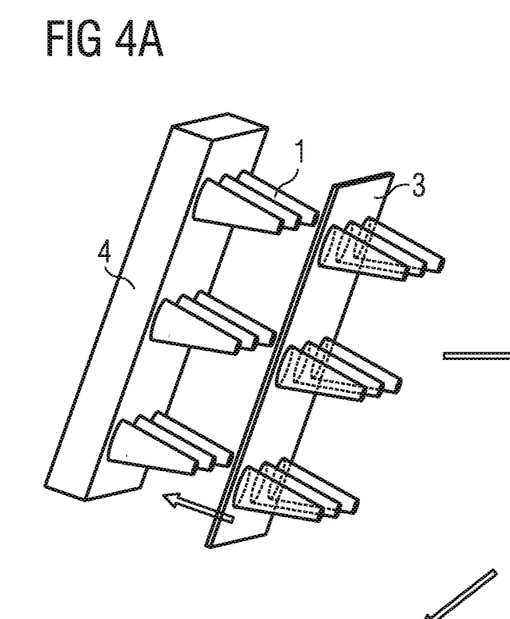
FIG. 4 shows an embodiment of a method for producing the optical package.
Figure 4B:
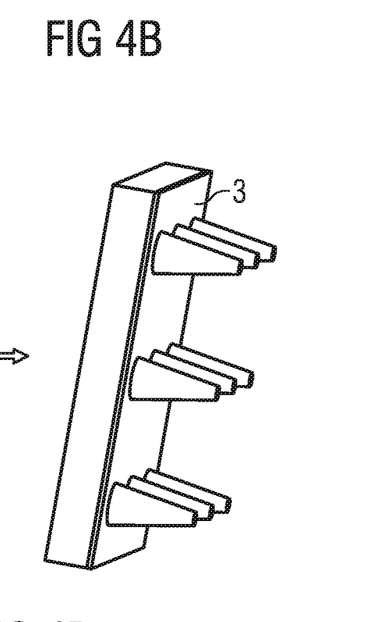

An array of aspheric lenses 1 is formed by a clear and transparent mold compound and distributed on a wafer surface. Each aspheric lens 1 is placed on a corresponding optical electric component 2 (see FIG. 4A). In a next step, the reflective layer 3 including the reflective material is deposited on the wafer surface, the lateral surfaces 12 and the upper surfaces 11 of the aspheric lenses 1. The drawing 4B depicts the resulting optical package after reflective metal deposition.

In a next step, the encasement 7 is formed by application of black filler material. Typically, in this step the encasement 7 completely encapsulates the aspheric lenses 1. Small apertures 10 are provided in the encasement 7 after CMP grinding and polishing (see FIG. 4C). The apertures 10 expose the upper surfaces 11 of the aspheric lenses 1 for light entrance. The wafer prepared in this way can then be singulated or diced into separate final optical packages (see FIG. 4D).

Figure 4C:
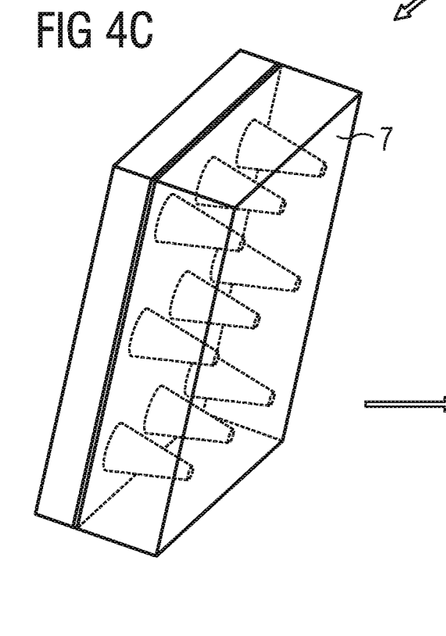
Figure 4D:
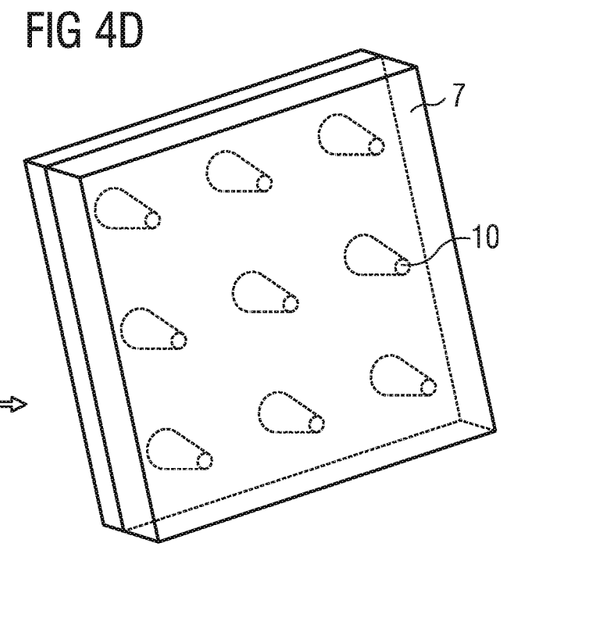

This process allows us to form rather small apertures that in combination with the aspheric lenses guarantee good optical performance. The conical lenses in this embodiment could assume other shapes such as lenses with weakly hyperbolic or parabolic curves lateral surfaces 12. However, the general result is that in combination with the reflective layer also inverted tapered shapes will give a wide field of view to the outside world, while presenting a much narrower angular field of view to interference filters that may cover the optoelectric components 2. This is desirable because interference filters generally develop erroneous shifts in their spectral filtering characteristics for incident light that impinges at larger off-axis angles of incidence.

One issue that has not been addressed is the use of "runners" used in the molding of the lenses, for example, and how these runners provide some leakage for light entering from the side of the package. The runners are necessary during the process where the liquid clear compound is initially injected into the mold. Generally the runners are minimized in cross-section so as to minimize the optical leakage.

The invention claimed is:
1. An optical package, comprising:
 a carrier comprising electrical interconnections,
 an optoelectric component arranged for detecting and/or emitting electromagnetic radiation in a specified wavelength range, mounted on the carrier or integrated into the carrier, and electrically connected to the electric interconnections,
 an aspheric lens having an upper surface, a lateral surface, and a bottom surface, wherein the bottom surface is arranged at or near the optoelectric component, wherein the upper surface is smaller than the bottom surface, and wherein the aspheric lens comprises a material which is at least transparent in the specified wavelength range, and
 a reflective layer comprising a reflective material, wherein the reflective layer at least partly covers the lateral surface of the aspheric lens, and wherein the reflective material is at least partly reflective in the specified wavelength range.

2. The optical package according to claim 1, wherein
 the aspheric lens has an optical axis, and
 the lateral surface, at least in sections, has an aspheric surface profile with respect to the optical axis.

3. The optical package according to claim 2, wherein the aspheric surface profile, at least in sections, is
hyperbolic,
parabolic,
elliptical, and/or
linear,
conical, and/or
tapered
or a frustum thereof.

4. The optical package according to claim 3, wherein a length of the aspheric lens along its optical axis is at least equal or greater than a width of the bottom surface.

5. The optical package according to claim 4, wherein the width of the bottom surface is at least equal or greater than a width of a light sensitive area or light emitting area of the optoelectric component.

6. The optical package according to claim 1, further comprising an encasement which is arranged on the carrier, wherein
the encasement comprises a filler material, and
the encasement comprises sidewalls which at least partly enclose the lateral surface of the aspheric lens.

7. The optical package according to claim 6, wherein
the reflective layer is coated onto the lateral surface of the aspheric lens or
the reflective layer is coated onto the sidewalls of the encasement.

8. The optical package according to claim 1, wherein
the reflective layer covers the lateral surface completely, and/or
the reflective layer covers at least parts of a main surface of the carrier, in particular covers the main surface of the carrier completely.

9. The optical package according to claim 1, wherein the reflective material of the reflective layer comprises at least one type of metal and/or a metal alloy, in particular, aluminum, chrome, gold, silver and/or an alloy thereof.

10. The optical package according to claim 1, wherein the filler material is opaque at least in the specified wavelength range, in particular the filler material comprises a moldable material.

11. The optical package according to claim 1, wherein the optoelectric component comprises:
an optical sensor,
an ambient light sensor,
a color sensor, and/or
an optical proximity sensor.

12. The optical package according to claim 1, wherein the optoelectric component comprises:
a photodiode, and/or
a light emitting diode.

13. The optical package according to claim 1, wherein the encasement comprises an aperture at or near the upper surface arranged for light entrance into the aspheric lens.

14. The optical package according to claim 1, wherein a diffuser is arranged at or near the upper surface of the aspheric lens.

15. A method of producing an optical package, the method comprising:
providing a wafer as a carrier having electrical interconnections,
mounting a plurality of optoelectric components on the wafer or into the wafer, wherein the optoelectric components are arranged for emitting and/or detecting electromagnetic radiation in a specified wavelength range,
electrically connecting the optoelectric components to the electric interconnections,
forming a plurality of aspheric lenses, each having a respective upper surface, a respective lateral surface, and a respective bottom surface from a material which is at least transparent in the specified wavelength range, wherein each of the bottom surfaces is arranged at or near a respective one of the optoelectric components, and wherein each of the upper surfaces is smaller than a respective one of the bottom surfaces,
arranging the aspheric lenses with each of the bottom surfaces at or near a respective one of the optoelectric components, and
at least partly covering the upper surfaces and the lateral surfaces of the aspheric lenses with a reflective layer comprising a reflective material, wherein the reflective material is at least partly reflective in the specified wavelength range,
forming an encasement on the wafer using a filler material such that sidewalls are formed which at least partly enclose the lateral surfaces of the aspheric lenses, and such that apertures are formed in the encasement at or near the upper surfaces of the aspheric lenses,
wherein the upper surfaces of the aspheric lenses protrude into the aperture or the upper surfaces are modified to be flush with an outer surface of the encasement,
removing at least a portion of the reflective layer from the upper surfaces, and
singulating the wafer carrying the plurality of optoelectric components into single optical packages.

16. The method according to claim 15, wherein the reflective layer is coated at least on the sidewalls of the encasement or the reflective layer is coated on the lateral surfaces of the aspheric lenses.

17. An optical package, comprising:
a carrier comprising electrical interconnections,
an optoelectric component arranged for detecting and/or emitting electromagnetic radiation in a specified wavelength range, mounted on the carrier or integrated into the carrier, and electrically connected to the electric interconnections,
an aspheric lens having an upper surface, a lateral surface, and a bottom surface opposite the upper surface, wherein the bottom surface is arranged at or near the optoelectric component, wherein the upper surface is smaller than the bottom surface, and wherein the aspheric lens comprises a material which is at least transparent in the specified wavelength range, and
a reflective layer comprising a reflective material, wherein the reflective layer at least partly covers the lateral surface of the aspheric lens, and wherein the reflective material is at least partly reflective in the specified wavelength range,
wherein the aspheric lens is configured to receive at least a first portion light incident upon the upper surface at a first angle of incidence relative to a normal of the upper surface, and guide the at least first portion of light towards the bottom surface according to a second first angle of incidence relative to the normal of the upper surface, the first angle of incidence being greater than the second angle of incidence.

18. A method of producing an optical package, comprising the steps of:
providing a wafer as carrier having electrical interconnections,
mounting a plurality of optoelectric components on the wafer or into the wafer, wherein the plurality of optoelectric component are arranged for emitting and/or detecting electromagnetic radiation in a specified wavelength range, electrically connecting the plurality of optoelectric component to the electric interconnections, obtaining a plurality of aspheric lenses, each aspheric lens having a respective upper surface, a respective lateral surface, and a respective bottom surface, the plurality of aspheric lenses being formed from a material which is at least transparent in the specified wavelength range, arranging each of the aspheric lenses with its bottom surface at or near a respective one of the optoelectric components, covering the lateral surfaces and the upper surfaces of the plurality of aspheric lenses with a reflective layer comprising a reflective material, wherein the reflective material is at least partly reflective in the specified wavelength range, forming an encasement on the wafer using a filler material such that sidewalls are formed which at least partly enclose the lateral surfaces of the plurality of aspheric lenses, wherein apertures are formed in the encasement at or near the upper surfaces of the plurality of aspheric lenses, wherein the upper surfaces of the plurality of aspheric lenses protrude into the apertures or the upper surfaces are modified to be flush with an outer surface of the encasement, and removing at least a portion of the reflective layer from the upper surface, and singulating the wafer carrying the plurality of optoelectric components into single optical packages.

* * * * *